US011189592B2

(12) United States Patent
Upendra et al.

(10) Patent No.: US 11,189,592 B2
(45) Date of Patent: Nov. 30, 2021

(54) MULTI-CLIP STRUCTURE FOR DIE BONDING

(71) Applicant: Infineon Technologies Austria AG, Villach (AT)

(72) Inventors: Balehithlu Manjappaiah Upendra, Singapore (SG); Dexter Reynoso, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/588,127

(22) Filed: Sep. 30, 2019

(65) Prior Publication Data
US 2020/0105707 A1    Apr. 2, 2020

(30) Foreign Application Priority Data
Oct. 2, 2018  (EP) .................................... 18198113

(51) Int. Cl.
*H01L 23/00* (2006.01)
*H01L 23/495* (2006.01)

(52) U.S. Cl.
CPC .............. *H01L 24/41* (2013.01); *H01L 24/35* (2013.01); *H01L 24/38* (2013.01); *H01L 24/40* (2013.01);
(Continued)

(58) Field of Classification Search
CPC ......... H01L 24/41; H01L 24/35; H01L 24/38; H01L 24/40; H01L 24/84; H01L 23/49555; H01L 23/49568; H01L 2224/358; H01L 2224/38; H01L 2224/40105; H01L 2224/40175; H01L 2224/4099; H01L 2224/41051; H01L 2224/41175; H01L 2224/84007; H01L 2224/84986; H01L 2224/32225; H01L 2224/3583; H01L 2224/35847; H01L 2224/37147; H01L 24/29; H01L 24/32; H01L 24/37; H01L 23/49558; H01L 23/49531; H01L 24/83; H01L 2224/29101; H01L 2224/2919; H01L 2224/32245; H01L 2224/35831; H01L 2224/37011; H01L 23/4334; H01L 23/49524; H01L 23/3735; H01L 2224/40225; H01L 2224/40245; H01L 2224/40993; H01L 2224/4103; H01L 2224/73263; H01L 2224/83801;
(Continued)

(56) References Cited
U.S. PATENT DOCUMENTS 6,091,332 A * 7/2000 Eberhardt ............ B65D 5/4233
                                                    340/572.1
7,479,345 B2 * 1/2009 Nakamura ............. H01R 12/52
                                                    429/129
(Continued)

FOREIGN PATENT DOCUMENTS

| CN | 100418217 C | 9/2008 |
| DE | 112015002815 T5 | 3/2017 |
| JP | 2013038359 A | 2/2013 |

*Primary Examiner* — Victor A Mandala
(74) *Attorney, Agent, or Firm* — Murphy, Bilak & Homiller, PLLC

(57) ABSTRACT

A multi-clip structure includes a first clip for die bonding and a second clip for die bonding. The multi-clip structure further includes a retaining tape fixed to the first clip and to the second clip to hold the first clip and the second clip together.

12 Claims, 4 Drawing Sheets

(52) U.S. Cl.
CPC ........ _H01L 24/84_ (2013.01); _H01L 23/49555_ (2013.01); _H01L 23/49568_ (2013.01); _H01L 2224/358_ (2013.01); _H01L 2224/38_ (2013.01); _H01L 2224/4099_ (2013.01); _H01L 2224/40105_ (2013.01); _H01L 2224/40175_ (2013.01); _H01L 2224/41051_ (2013.01); _H01L 2224/41175_ (2013.01); _H01L 2224/84007_ (2013.01); _H01L 2224/84986_ (2013.01)

(58) Field of Classification Search
CPC ..... H01L 2224/8384; H01L 2224/8385; H01L 2224/84005; H01L 2224/84801; H01L 2224/84815; H01L 2224/8482; H01L 2224/8484; H01L 2224/8485; H01L 2224/84862; H01L 2924/10253; H01L 2924/10271; H01L 2924/10272; H01L 2924/10329; H01L 2924/1033; H01L 2924/10337; H01L 2924/10339; H01L 2924/10344; H01L 2924/12031; H01L 2924/12032; H01L 2924/13055; H01L 2924/13062; H01L 2924/13064; H01L 2924/13091; H01L 2924/2924; H01L 2924/14; H01L 2924/14252; H01L 2924/15747; H01L 2924/181; H01L 23/49517; H01L 23/3107; H01L 21/50; H01L 24/80; H01L 21/56
See application file for complete search history.

(56) References Cited

U.S. PATENT DOCUMENTS

| | | | | |
|---|---|---|---|---|
| 10,074,590 | B1* | 9/2018 | Pavier | H01L 24/48 |
| 2007/0145573 | A1* | 6/2007 | Otremba | H01L 24/41 |
| | | | | 257/718 |
| 2012/0313232 | A1* | 12/2012 | Zhang | H01L 23/49524 |
| | | | | 257/676 |
| 2014/0301039 | A1* | 10/2014 | Otremba | H05K 7/20 |
| | | | | 361/689 |
| 2015/0162287 | A1* | 6/2015 | Hosseini | H01L 29/2003 |
| | | | | 257/139 |
| 2015/0206830 | A1* | 7/2015 | Takada | H01L 24/92 |
| | | | | 257/676 |
| 2018/0040541 | A1* | 2/2018 | Choi | H01L 23/49568 |
| 2018/0097425 | A1* | 4/2018 | Bader | H02K 11/33 |
| 2018/0182730 | A1* | 6/2018 | Cho | H01L 24/84 |
| 2018/0190573 | A1* | 7/2018 | Mullenix | H01F 17/04 |

* cited by examiner

MULTI-CLIP STRUCTURE FOR DIE BONDING

TECHNICAL FIELD

This disclosure relates to the field of semiconductor device packaging, and in particular to the technique of attaching a clip to a die.

BACKGROUND

Packaging a die in a semiconductor device often requires connecting electrical terminals to the die. Wire bonding, ribbon bonding and clip bonding are viable options for die bonding. Wire bonding and clip bonding are sometimes combined in one package so as to benefit from the distinguishing characteristics of these techniques. While clip bonding allows for low electrical and thermal resistance, wire bonding is easy to automate and inexpensive in manufacture.

Clip bonding requires the clip to be precisely placed on the die and aligned to the contacts to be connected. Clip dislocation or misalignment may impact the performance of the device or may result in scrap parts.

SUMMARY

A multi-clip structure includes a first clip for die bonding and a second clip for die bonding. Further, the multi-clip structure includes a retaining tape fixed to the first clip and to the second clip to hold the first clip and the second clip together.

A semiconductor device package includes a die carrier and a die mounted on the die carrier. The semiconductor device package further includes a first clip bonded to a first electrode of the die and a second clip bonded to the first electrode or a second electrode of the die. A mold compound encapsulates the die, the first clip and the second clip, wherein the first clip and the second clip are cast-in-place by the mold compound and are completely encapsulated by the mold compound.

A method of attaching a multi-clip structure to a die comprises providing a multi-clip structure comprising a first clip for die bonding, a second clip for die bonding and a retaining tape fixed to the first clip and to the second clip to hold the first clip and the second clip together. The multi-clip structure is placed as one component over the die.

A method of manufacturing a semiconductor device package comprises placing a die on a die carrier; placing a multi-clip structure as one component over the die, wherein the multi-clip structure comprises a first clip for die bonding, a second clip for die bonding and a retaining tape fixed to the first clip and to the second clip to hold the first clip and the second clip together; attaching the multi-clip structure to the die and to external terminals of the semiconductor device package; and encapsulating the die and the multi-clip structure by cavity molding.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
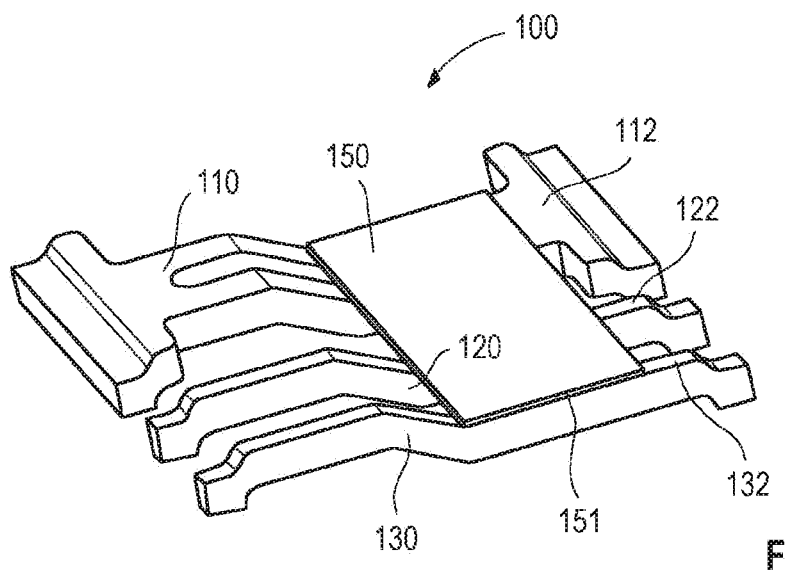
FIG. 1 is a top perspective view of an exemplary multi-clip structure.

It is to be understood that the features of the various exemplary embodiments and examples described herein may be combined with each other, unless specifically noted otherwise.

As used in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "directly on", e.g. in direct contact with, the implied surface. The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer.

Semiconductor device packages containing one or more (semiconductor) dice are, inter alia, described herein. In particular, one or more power dice may be accommodated in the semiconductor device package. A die may monolithically integrate, e.g., one or more transistors and/or diodes, e.g. one or more transistors or diodes of any of the types recited below.

A die may, for example, be configured as including one or more MISFETs (Metal Insulator Semiconductor Field Effect Transistors), MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), bipolar transistors or diodes such as, e.g., PIN diodes or Schottky diodes.

A die may, e.g., have a vertical structure, i.e. be fabricated in such a way that electric currents can flow in a direction perpendicular to the main surfaces of the die. A die having a vertical structure may have electrodes (die pads) on its two main surfaces, i.e. on its upper surface and bottom surface. Dice having a vertical structure may, e.g., be power dice.

A die may, e.g., have a horizontal structure. A die having a horizontal structure may have electrodes (die pads) only on one of its two main surfaces, e.g. on its active and/or upper surface. Dice such as logic integrated circuits (ICs) dice as well as power dice (e.g. power MISFETs or power MOSFETs or power JFETs or power HEMTs) may have a horizontal structure.

A die may be manufactured from semiconductor material(s) such as, e.g., Si, SiC, SiGe, GaAs, GaN, AlGaN, InGaAs, InAlAs, etc, and may, e.g., contain inorganic and/or organic materials that are not semiconductors. In particular, a die made of multiple layers of the above materials, such as a GaN-on-Si die or a GaN-on-SiC die may be involved.

A semiconductor device package as described herein may further include one or more logic ICs to control a power die (or dice). The logic IC(s) may include one or more driver circuits to drive one or more of the power dice.

A semiconductor device package as described herein may further include a mold compound. The mold compound may be of an electrically insulating material, e.g. a polymer material. The mold compound may comprise or be a thermoset material or a thermoplastic material. A thermoset material may, e.g., be made on the basis of an epoxy resin, a silicone resin or an acrylic resin. A thermoplastic material may, e.g., comprise one or more materials selected from the group of polyetherimide (PEI), polyether-sulfone (PES), polyphenylene-sulfide (PPS), polyamide-imide (PAI), and polyethylene-terephthalate (PET).

The mold compound may be fabricated by cavity molding. Various techniques such as, e.g., compression molding, injection molding, powder molding, transfer molding may be used to form the mold compound. During cavity molding, the mold material may be applied to directly overmold the multi-clip structure and the die (ore dice) to which the multi-clip structure is bonded.

A variety of different types of electronic devices may be implemented in a semiconductor device package as described herein. By way of example, electronic devices in accordance with the disclosure may constitute, e.g., a power supply, a DC-DC voltage converter, an AC-DC or DC-AC voltage converter, a (power) amplifier, an engine control unit (ECU), and many other devices.

FIG. 1 illustrates a top perspective view of an exemplary multi-clip structure 100. The multi-clip structure 100 may include a first clip 110 and a second clip 120. A retaining tape 150 is fixed to the first clip 110 and to the second clip 120 to hold the first clip 110 and the second clip 120 together.

Further, as exemplified in FIG. 1, the multi-clip structure 100 may optionally include more than two clips 110, 120, e.g. a third clip 130. The third clip 130 is also fixed to the retaining tape 150 and held together with the first clip 110 and the second clip 120 by the retaining tape 150. Generally, the multi-clip structure 100 may have N clips 110, 120, 130 held together by the retaining tape 150, wherein N is an integer equal to or greater than 2, 3, 5, 10, 15, etc.

In the following, any disclosure related by way of example to a multi-clip structure 100 of two or three clips is analogously applicable to a multi-clip structure of N clips, unless explicitly stated otherwise.

The first, second and third clips 110, 120, 130 may have longitudinal directions which are parallel to each other.

The retaining tape 150 may extend in transverse direction to the longitudinal direction of the first clip 110, the second clip 120 and/or the third clip 130.

Figure 2:
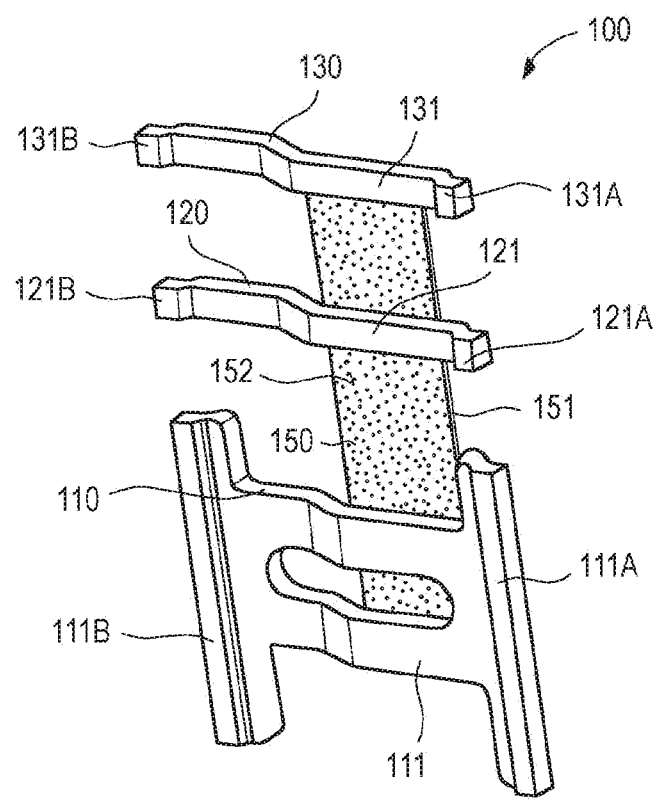
FIG. 2 is a bottom perspective view of the exemplary multi-clip structure of FIG. 1.

As apparent from FIG. 2, the first clip 110 may comprise a lower surface 111 including a die bonding portion 111A and an upper surface 112 opposite the lower surface 111. The second clip (third clip) 120 (130) may comprise a lower surface 121 (131) including a die bonding portion 121A (131A) and an upper surface 122 (132) opposite the lower surface 121 (131). The lower surfaces 111, 121, 131 may further include external terminal bonding portions 111B, 121B, 131B, respectively. The external terminal bonding portions 111B, 121B, 131B may be provided at distal ends of the clips 110, 120, 130 while the die bonding portions 111A, 121A, 131A may be provided at proximal ends of the clips 110, 120, 130, respectively.

The retaining tape 150 may engage with the upper surface 112 of the first clip 110 and with the upper surface(s) 122, 132 of the second clip 120 and/or third clip 130.

The retaining tape 150 may exclusively engage with the upper surfaces 112, 122, 132 of the first, second and/or third clips 110, 120, 130. That is, side surfaces of the clips 110, 120, 130 may not be in contact with the retaining tape 150. In various embodiments, side surfaces of the first, second and/or third clips 110, 120, 130 may be exposed, i.e. an open space may be defined between opposing side surfaces of the first, second and/or third clips 110, 120, 130. In other words, no spacer element(s) need(s) to be arranged between opposing side surfaces of the first, second and/or third clips 110, 120, 130.

Alternatively, the retaining tape 150 may (e.g. exclusively) engage with the lower surfaces 111, 121, 131 of the first, second and/or third clips 110, 120, 130 (not shown). Another option is to provide for two (not shown) parallel retaining tapes 150 between which the first, second and/or third clips 110, 120, 130 are sandwiched.

The retaining tape 150 may comprise a film 151 of an electrically insulating material. A surface of the film 151, which faces the first, second and/or third clips 110, 120, 130, may be coated by an adhesive 152 (see FIG. 2). That way, a mechanically secure connection can be established between the retaining tape 150 and the first, second and/or third clips 110, 120, 130.

The retaining tape 150 may have a uniform thickness across its longitudinal and/or transverse directions. The thickness of the retaining tape 150 may be equal to or less than or greater than 30 µm, 50 µm, 70 µm, 90 µm, 110 µm, 130 µm, 150 µm. In particular, the thickness of the retaining tape 150 may be in a range between 50 µm and 120 µm.

The minimum tape length (in transverse direction to the longitudinal directions of the first, second and/or third clips 110, 120, 130) may be equal to or greater than 2.0 mm, 2.5 mm, 3.0 mm, 3.5 mm, 4.0 mm. The minimum width of the retaining tape 150 (in a direction parallel to the longitudinal directions of the first, second and/or third clips 110, 120, 130) may be equal to or greater than 1.0 mm, 1.25 mm, 1.5 mm, 1.75 mm, 2.0 mm.

The retaining tape 150 may have a structural stability sufficient to hold the first clip 110, the second clip 120 and/or the third clip 130 in alignment during a pick-and-place operation. The retaining tape 150 may be sufficiently rigid or stiff to determine the positions of the first, second and/or third clips 110, 120, 130 relative to one another. The rigidity or stiffness of the retaining tape may be sufficiently high to ensure that the positions of the first, second and/or third clips 110, 120, 130 relative to each other are substantially predetermined and invariant during manipulation and/or transportation (e.g. pick-and-place operation) of the multi-clip structure 110. This may also hold true if only one or a subset of the clips 110, 120, 130 of the multi-clip structure 100 is picked by a pick-and-place tool (e.g. a vacuum tool element) during the pick-and-place operation.

In order to provide for a sufficient stiffness or rigidity of the retaining tape 150, the retaining tape 150 may comprise reinforcement elements such as, e.g., fibers (not shown) which may extend along the length of the retaining tape 150.

The retaining tape 150 (or, e.g., a film 151 forming a substrate layer of the retaining tape 150) may comprise or be a polymer material, e.g. a polyimide such as, e.g., Kapton®. The adhesive 152 may be an acrylic or silicone adhesive. The film 151 (e.g. polyimide substrate) may have high electrical insulation properties and heat resistance.

The retaining tape 150 may be configured to withstand a temperature of equal to or more than 360° C., 380° C., 400° C. As an example, polyimide can withstand more than 400° C.

The first, second and/or third clips 110, 120, 130 may be different in their dimensions, materials and/or current transportation capacities. As exemplified in FIGS. 1 and 2, the first clip 110 may have a cross-sectional area which may be equal to or greater than M1 times the cross-sectional area of the second clip 120 and/or the third clip 130. Further, the contact area between the retaining tape 150 and the (e.g. upper surface 112 of the) first clip 110 may be equal to or greater than M2 times the contact area between the retaining tape 150 and the (e.g. upper surface 122 of the) second clip 120 and/or the (e.g. upper surface 132 of the) third clip 130. M1 and M2 are integers equal to or greater than 1, 2, 3, 4, 5, . . . .

In the multi-clip structure 100, the first clip 110 may be a load clip for a power die 360, the second clip 120 may be a sense clip for the power die 360 and/or the third clip 130 may be a gate clip for the power die 360. That way, by means of the retaining tape 150, micro clips such as, e.g., sense clips and/or gate clips can be joined and handled together with a conventional load clip.

Figure 3:
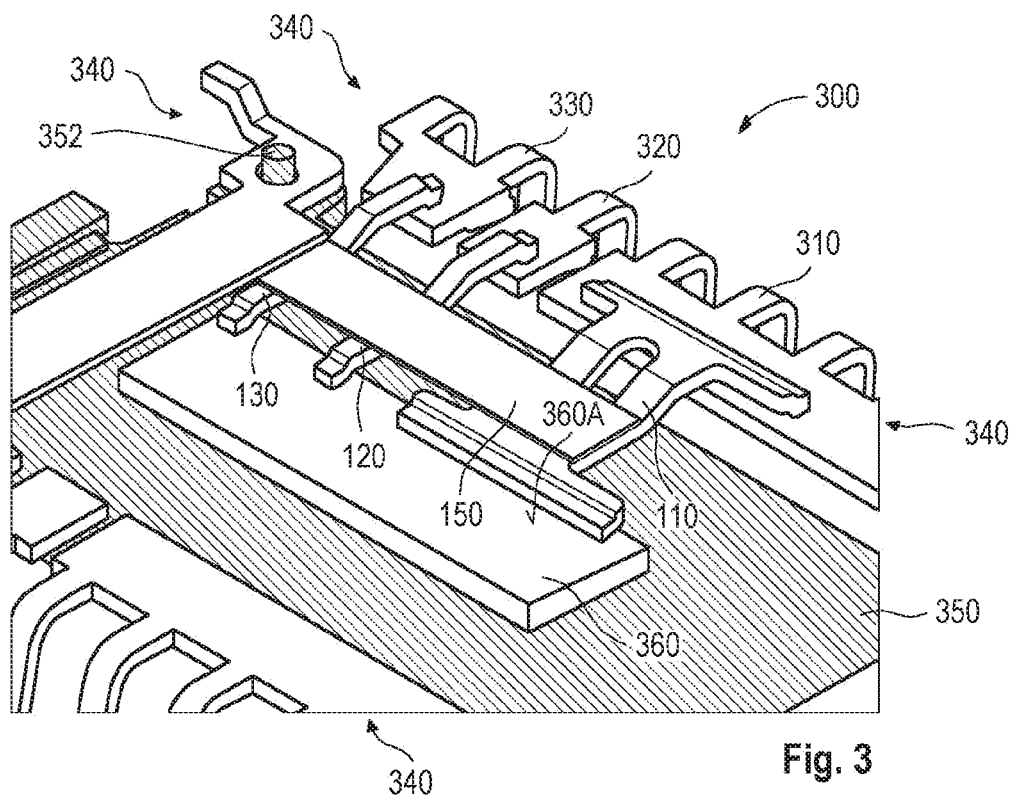
FIG. 3 is a partial perspective view of an exemplary semiconductor device package including the exemplary multi-clip structure of FIGS. 1 and 2 attached to a die and external terminals of the semiconductor device package.
Figure 4:
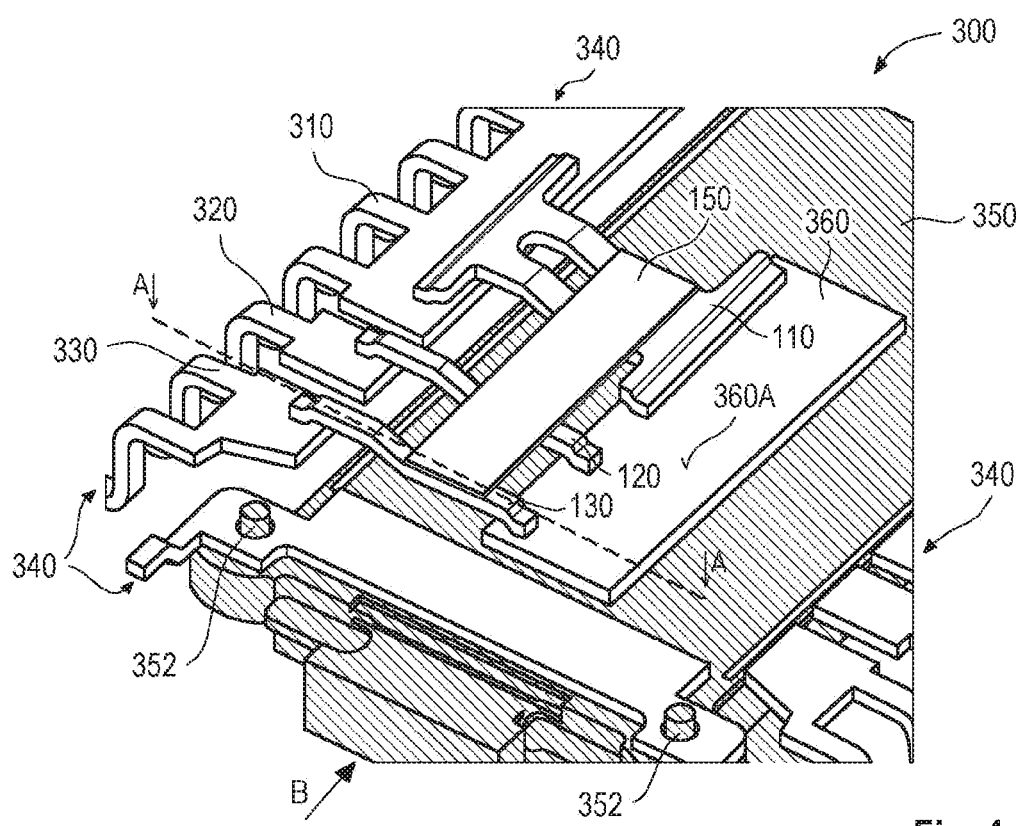
FIG. 4 is another partial perspective view of the exemplary semiconductor device package of FIG. 3.
Figure 5:
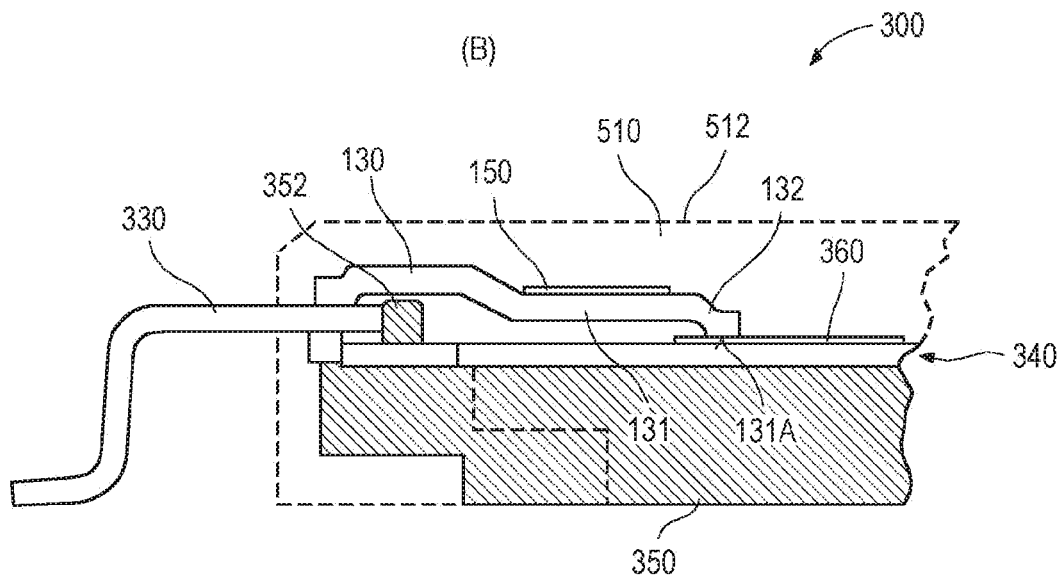
FIG. 5 is partial side view of the exemplary semiconductor device package from position B of FIG. 4.

FIGS. 3 to 6 illustrate partial views of an exemplary semiconductor device package 300 which includes the exemplary multi-clip structure 100. The perspective views of FIGS. 3 and 4 are illustrations in which an (optional) mold compound 510 is omitted for ease of illustration.

The semiconductor device package 300 includes a die carrier 350 and at least one die 360 mounted on the die carrier 350. The die 360 may, e.g., be a power die.

In a die 360 having a vertical structure the source electrode and the gate electrode of a MISFET or a MOSFET or a JFET or a HEMT may be situated on one main surface, e.g. the upper main surface 360A of the die 360, while the drain electrode of the MISFET or MOSFET or JFET or HEMT may be arranged on the opposite main surface. Analogously, in bipolar transistor dice having a vertical structure the emitter electrode and the gate electrode of an IGBT may be situated on one main surface, e.g. the upper main surface 360A of the die 360, while the collector electrode of the IGBT may be arranged on the opposite main surface. In case of a diode, the anode electrode may be situated on one main surface, e.g. the upper main surface 360A of the die 360, while the cathode electrode of the diode may be arranged on the opposite main surface. Further, it is also possible that the drain (collector) electrode and the gate electrode are situated on one main surface while the source (emitter) electrode is situated on the other main surface.

In a die 360 having a horizontal structure all electrodes (not shown) may be situated on one main surface, e.g. the upper main surface 360A of the die 360.

The first clip 110 is bonded to a first electrode (not shown) of the die 360. The first clip 110 may be a load clip and the first electrode of the die 360 may be a load electrode, e.g. a source electrode, a drain electrode, an emitter electrode, a collector electrode, an anode electrode or a cathode electrode.

The second clip 120 may be bonded either to the first electrode or to a second electrode of the die 360 which is distinct from the first electrode. The second clip 120 may, e.g., be a sense clip configured to sense a potential on a load electrode (e.g. first electrode) of the die 360.

The third clip 130 of the multi-clip structure 100 may be a gate clip for the die 360 which is bonded to a third electrode (not shown) of the die 360. The third electrode of the die 360 may be a control electrode (e.g. gate electrode) of the die 360. As mentioned above, the multi-clip structure 100 needs only to consist of at least two clips, e.g. first and second clips 110, 120 or first and third clips 110, 130.

The clips 110, 120, 130 may be of a metal or metal alloy material, e.g. copper or a copper alloy. The clips 110, 120, 130 may have been formed by an etching process, a stamping process and/or a bending process for generating and shaping the clips 110, 120, 130 appropriately.

The semiconductor device package 300 may further include first external terminals 310, second external terminals 320 and/or third external terminals 330. The first, second and third external terminals 310, 320, 330 may, e.g., be leads of a leadframe 340.

As apparent from FIGS. 3 and 4, the semiconductor device package 300 may be designed as a DSO (Double Side Outline) package. A DSO package has external terminals only on two opposed sides of the semiconductor device package 300. As illustrated in FIGS. 3 and 4, the external terminals 310, 320, 330 (e.g. leads of a leadframe 340) may be arranged at only one of the two longitudinal sides of the semiconductor device package 300. The external terminals 310, 320, 330 may protrude out of a package body 512 of the semiconductor device package 300, wherein the mold compound 510 may form the package body 512 of the semiconductor device package 300.

In various embodiments the semiconductor device package 300 is a wireless package. The meaning of wireless is that no bond wires are contained in the semiconductor device package 300 to connect electrodes of the die 360 to external terminals 310, 320, 330 of the semiconductor device package 300.

In various embodiments the (power) die 360 is exclusively bonded to external terminals 310, 320, 330 by clips 310, 320, 330, i.e. no bond wires are used to contact the die 360. However, a second or further dice (not shown) may be accommodated in the semiconductor device package 300 and may be connected to outer terminals by bond wires. Such further dice (not shown) may, e.g., be logic ICs to control the power die (or power dice) 360. Such semiconductor device package 300 is a clip plus bond wire package, with, however, at least one die 360 which is exclusively connected by clips 310, 320, 330 (and optionally also by the die carrier 350) to outer terminals of the semiconductor device package 300.

The die carrier 350 may be a heat sink element, e.g. a bulk metal plate. As shown in FIGS. 3 to 6, such bulk metal plate may be connected to the leadframe 340 by, e.g., mechanical fastening means such as, e.g., pin connectors 352. In other embodiments, the die carrier 350 may be an integral part of the leadframe 340, e.g. a die pad of the leadframe 340 (not shown).

The die carrier 350 may be or comprise of any metal or metal alloy, e.g. copper or copper alloy. In other embodiments the die carrier 350 may be a PCB (Printed Circuit Board) or a metal bonded ceramics substrate, e.g. a DCB (Direct Copper Bonded) ceramics substrate.

The die 360 may be bonded to the die carrier 350 by any suitable means, e.g., by soldering, sintering, or adhesive bonding. The connection between the die 360 and the die carrier 350 may be electrically conducting (e.g. if the die 360 has a vertical structure and/or is used for load current transportation purposes) or may be electrically insulating, e.g. if the die carrier 350 is not used for load current transportation purposes.

The electrical and mechanical connections between the clips 110, 120, 130 and the die 360 and between the clips 110, 120, 130 and the external terminals 310, 320, 330 are, e.g., of a solder or diffusion solder material or of an electrically conducting paste (e.g. nanopaste), a sinter material or an electrically conducting adhesive.

Figure 6:
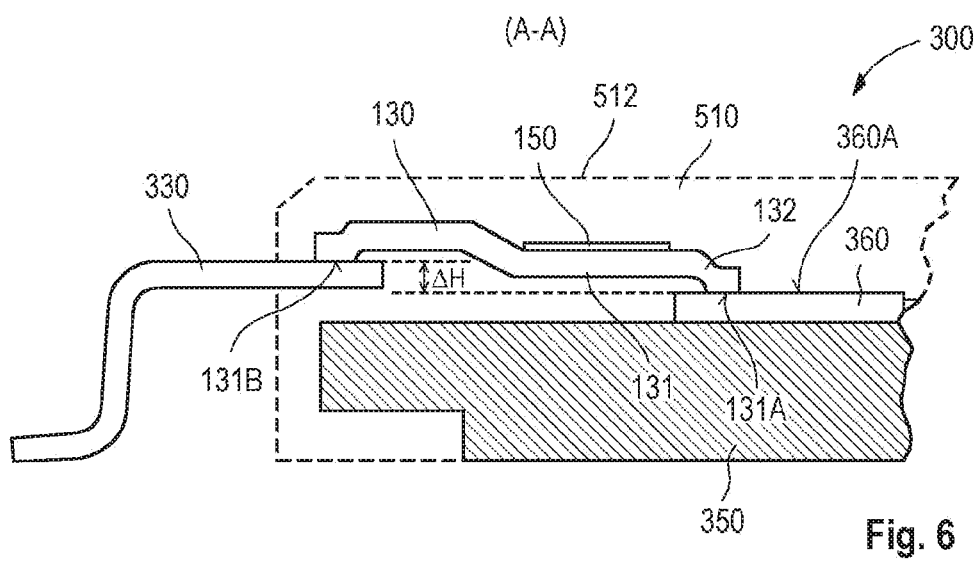
FIG. 6 is partial sectional view of the exemplary semiconductor device package along line A-A of FIG. 4.

As illustrated in FIG. 6, the first, second and/or third clip 110, 111, 112 may overcome a difference in height ΔH from their die bonding portions 111A, 121A, 131A to their external terminal bonding portions 111B, 121B, 131B. The difference in height ΔH may, e.g., be equal to or greater than or less than 50 μm, 100 μm, 150 μm, 200 μm. By way of example, the level of the external terminal bonding portions 111B, 121B, 131B may be above the level of the die bonding portions 111A, 121A, 131A, respectively.

The first clip 110, the second clip 120 and/or the third clip 130 may be completely encapsulated by the mold compound 510, i.e., they do not protrude out of the package body 512. Further, the first, second and/or third clips 110, 120, 130 are cast-in-place by the mold compound 510. Hence, the first, second and/or third clips 110, 120, 130 are not designed as a premolded clip structure which is overmolded by the mold compound 510. Rather, the mold compound 510 may be in direct contact to all exposed surfaces of the first, second and/or third clips 110, 120, 130. In particular, the mold compound 510 may be arranged between opposing side surfaces of the first, second and/or third clip 110, 120, 130 and may, e.g., be in direct contact to the opposing side surfaces of the first, second and/or third clip 110, 120, 130.

The retaining tape 150 may also be completely encapsulated and/or overmolded by the mold compound 510. However, as the retaining tape 150 is no longer needed after the process of bonding the multi-clip structure 100 to the die 360 and the first, second and/or third external terminals 310, 320, 330, the retaining tape 150 could optionally be removed before the application of the mold compound 510, i.e. before the step of cavity molding (i.e. molding the package body 512). Therefore, the retaining tape 150 may optionally not be accommodated in the package body 512.

If the retaining tape 150 is cast-in-place by the mold compound 510 together with the first, second and/or third clips 110, 120, 130, the surface of the retaining tape 150 which faces the first, second and/or third clips 110, 120, 130 (e.g. the surface of the film 151 coated by adhesive 152) may be in direct contact to the mold compound 510.

In various embodiments, the multi-clip structure 100 may be surrounded and/or embedded in the mold compound 510 at all exposed surfaces except the die bonding portions 111A, 121A, 131A and the external terminal bonding portions 111B, 121B, 131B.

Figure 7:
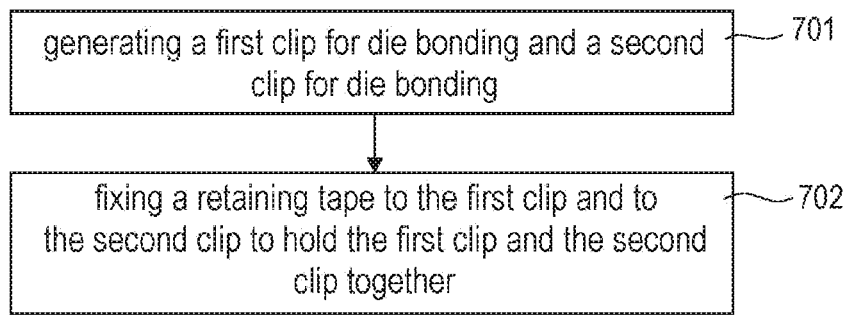
FIG. 7 is a flowchart illustrating an example of a method of manufacturing a multi-clip structure.

The flowchart of FIG. 7 exemplifies a method of manufacturing a multi-clip structure 100. At 701, a first clip 110 for die bonding and a second clip 120, 130 for die bonding are generated. Etching, stamping, bending and other machining processes may be used.

At 702 the retaining tape 150 is fixed to the first clip 110 and to the second clip 120, 130 to hold the first clip 110 and the second clip 120, 130 together. That way, the multi-clip structure 100 becomes one easy-to-manage single piece.

Fixing the retaining tape 150 to the first clip 110 and to the second clip 120, 130 may comprise disposing an adhesive 152 between a film 151 of the retaining tape 150 and the first clip 110 and the second clip 120, 130. The retaining tape 150 may then be fixed to the first clip 110 and the second clip 120, 130 by the adhesive 152. The retaining tape 150 may be applied to the first clip 110 and the second clip 120, 130 by application of pressure. The retaining tape 150 may be fixed to the first clip 110 and the second clip 120, 130 before the clips 110, 120, 130 are separated from each other by, e.g., cutting portions of the clips 110, 120, 130 which are interconnected by tie-bars.

Figure 8:
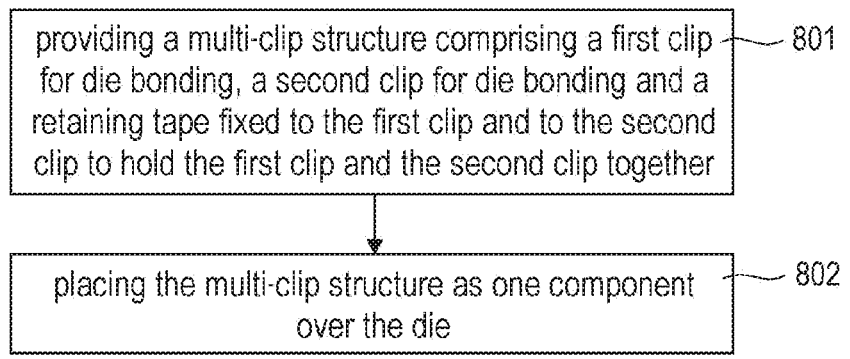
FIG. 8 is a flowchart illustrating an example of a method of attaching a multi-clip structure to a die.

Referring to the flowchart of FIG. 8, an exemplary method of attaching a multi-clip structure 100 to a die 360 is described. At 801 the multi-clip structure 100 comprising the first clip 110 for die bonding, a second clip 120, 130 for die bonding and a retaining tape 150 fixed to the first clip 110 and to the second clip 120, 130 to hold the first clip 110 and the second clip 120, 130 together is provided. By way of example, the semiconductor device package manufacture may use a multi-clip structure 100 purchased from a supplier.

At 802 the multi-clip structure 100 is placed as one component over the die 360. Placing may be done by one (single) pick-and-place operation. By way of example, the multi-clip structure 100 may be grasped by a pick-and-place tool (e.g. a vacuum holder), transferred over the die 360, put down over the die 360 and then released from the pick-and-place tool.

Due to its mechanical properties (stiffness, rigidity) the retaining tape 150 may provide for accurate alignment of the first clip 110, the second clip 120 and/or the third clip 130 when the multi-clip structure 100 is placed over the die 360. Misalignment of the multi-clip structure 100 towards the contacts to be connected could be avoided or easily corrected. The accuracy of alignment of the multi-clip structure 100 may be monitored by optical inspection. The multi-clip structure 100 may then be attached to the die 360 as one component.

Figure 9:
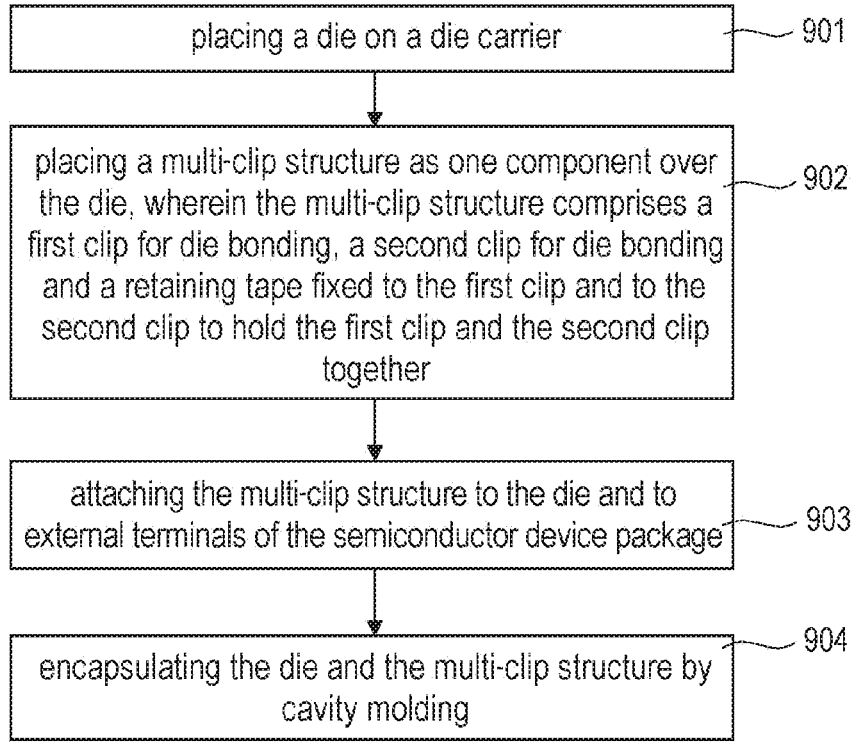
FIG. 9 is a flowchart illustrating an example of a method of manufacturing a semiconductor device package.

An exemplary method of manufacturing a semiconductor device package 300 is illustrated by the flowchart of FIG. 9. At 901 a die 360 is placed on a die carrier 350. Placing may be accomplished by a pick-and-place operation.

At 902 the multi-clip structure 100 is placed as one component over the die 360. Reference is made to the description at 802 to avoid reiteration.

At 903 the multi-clip structure 100 is attached to the die 360 and to external terminals of the semiconductor device package 300 as one component. A solder reflow process and/or an oven cure process may be used. Soldering, sintering, conductive adhesive or any other techniques may be used to generate the bond connections between the clips 110, 120, 130 and the die 360 as well as the first, second and/or third external terminals 310, 320, 330. Further, the reflow soldering and/or oven curing process may simultaneously be used to attach the die 360 to the die carrier 350, if this connection has not been established so far.

At 904 the die 360 and the multi-clip structure 100 are encapsulated by cavity molding. By way of example, transfer molding or any of the previously mentioned molding processes may be used. Cavity molding may use mold tools in-between which a cavity is formed which conforms to the shape of the package body 512. That is, after molding and opening the mold, the finally shaped package body 512 may be taken out of the mold. Each package body 512 may be molded individually in one mold. No subsequent package singularization step as in eWLP (embedded Wafer Level Packaging) is needed.

The following examples pertain to further aspects of the disclosure:

Example 1 is a multi-clip structure comprising a first clip for die bonding, a second clip for die bonding, and a retaining tape fixed to the first clip and to the second clip to hold the first clip and the second clip together.

In Example 2, the subject matter of Example 1 can optionally include wherein the first clip is a load clip for a power die and the second clip is a sense clip for the power die or a gate clip for the power die.

In Example 3, the subject matter of Example 1 or 2 can optionally include a third clip for die boding, wherein the retaining tape is fixed to the third clip.

In Example 4, the subject matter of Example 3 can optionally include wherein the first clip is a load clip for a power die, the second clip is a sense clip for the power die and the third clip is a gate clip for the power die.

In Example 5, the subject matter of any one of Examples 1 to 4 can optionally include wherein the first clip comprises a lower surface including a die bonding portion and an upper surface opposite the lower surface, the second clip comprises a lower surface including a die bonding portion and an upper surface opposite the lower surface, and the retaining tape engages with the upper surface of the first clip and with the upper surface of the second clip.

In Example 6, the subject matter of any one of Examples 1 to 5 can optionally include wherein the retaining tape comprises a film of an electrically insulating material coated by an adhesive.

In Example 7, the subject matter of any one of Examples 1 to 5 can optionally include wherein the retaining tape has a structural stability sufficient to hold the first clip and the second clip in alignment during a pick-and-place operation.

Example 8 is a semiconductor device package comprising a die carrier, a die mounted on the die carrier, a first clip bonded to a first electrode of the die, a second clip bonded to the first electrode or a second electrode of the die, and a mold compound encapsulating the die, the first clip and the second clip, wherein the first clip and the second clip are cast-in-place by the mold compound and are completely encapsulated by the mold compound.

In Example 9, the subject matter of Example 8 can optionally include a retaining tape fixed to the first clip and to the second clip.

In Example 10, the subject matter of Example 8 or 9 can optionally include wherein the semiconductor device package is a wireless package.

In Example 11, the subject matter of any one of Examples 8 to 10 can optionally include wherein the die is a power die, the first clip is a load clip for the power die and the second clip is a sense clip for the power die or a gate clip for the power die.

In Example 12, the subject matter of any one of Examples 8 to 11 can optionally include a first external terminal of the semiconductor device package, and a second external terminal of the semiconductor device package, wherein the first clip is bonded to the first external terminal and the second clip is bonded to the second external terminal.

In Example 13, the subject matter of Example 12 can optionally include wherein the first and second external terminals are leads of a leadframe and the die carrier is a heat sink element and/or a die pad of the leadframe.

Example 14 is a method of attaching a multi-clip structure to a die, the method comprising: providing a multi-clip structure comprising a first clip for die bonding, a second clip for die bonding and a retaining tape fixed to the first clip and to the second clip to hold the first clip and the second clip together; and placing the multi-clip structure as one component over the die.

In Example 15, the subject matter of Example 14 can optionally include wherein placing is done by one pick-and-place operation.

Example 16 is a method of manufacturing a semiconductor device package, the method comprising: placing a die on a die carrier; placing a multi-clip structure as one component over the die, wherein the multi-clip structure comprises a first clip for die bonding, a second clip for die bonding and a retaining tape fixed to the first clip and to the second clip to hold the first clip and the second clip together; attaching the multi-clip structure to the die and to external terminals of the semiconductor device package; and encapsulating the die and the multi-clip structure by cavity molding.

In Example 17, the subject matter of Example 16 can optionally include wherein encapsulating is done by transfer molding.

In Example 18, the subject matter of Example 16 or 17 can optionally include wherein encapsulating comprises that the mold compound is arranged between opposing side surfaces of the first and second clips.

In Example 19, the subject matter of Example 18 can optionally include wherein encapsulating comprises that a space defined by the opposing side surfaces of the first and second clips is completely filled by the mold compound.

In Example 20, the subject matter of Example 18 or 19 can optionally include wherein encapsulating comprises that the mold compound is in direct contact to the opposing side surfaces of the first and second clips.

In Example 21, the subject matter of any of Examples 16 to 20 can optionally include wherein encapsulating comprises that the multi-clip structure is embedded in the mold compound at all exposed surfaces except die bonding portions and external terminal bonding portions.

Example 22 is a method of manufacturing a multi clip structure, the method comprising: generating a first clip for die bonding and a second clip for die bonding; and fixing a retaining tape to the first clip and to the second clip to hold the first clip and the second clip together.

In Example 23, the subject matter of Example 22 can optionally include wherein fixing comprises: disposing an adhesive between a film of the retaining tape and the first clip and between the film of the retaining tape and the second clip; and fixing the retaining tape to the first clip and to the second clip by the adhesive.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A multi-clip structure comprising:
   a first clip for die bonding;
   a second clip for die bonding; and
   a retaining tape fixed to the first clip and to the second clip to hold the first clip and the second clip together.

2. The multi-clip structure of claim 1, wherein the first clip is a load clip for a power die and the second clip is a sense clip for the power die or a gate clip for the power die.

3. The multi-clip structure of claim 1, further comprising:
   a third clip for die boding, wherein the retaining tape is fixed to the third clip.

4. The multi-clip structure of claim 3, wherein the first clip is a load clip for a power die, the second clip is a sense clip for the power die and the third clip is a gate clip for the power die.

5. The multi-clip structure of claim 1, wherein
   the first clip comprises a lower surface including a die bonding portion and an upper surface opposite the lower surface;
   the second clip comprises a lower surface including a die bonding portion and an upper surface opposite the lower surface; and
   the retaining tape engages with the upper surface of the first clip and with the upper surface of the second clip.

6. The multi-clip structure of claim 1, wherein the retaining tape comprises a film of an electrically insulating material coated by an adhesive.

7. The multi-clip structure of claim 1, wherein the retaining tape has a structural stability sufficient to hold the first clip and the second clip in alignment during a pick-and-place operation.

8. A semiconductor device package comprising:
   a die carrier;
   a die mounted on the die carrier;
   a first clip bonded to a first electrode of the die;
   a second clip bonded to the first electrode or a second electrode of the die;
   a mold compound encapsulating the die, the first clip and the second clip, wherein the first clip and the second clip are cast-in-place by the mold compound and are completely encapsulated by the mold compound; and
   a retaining tape fixed to the first clip and to the second clip.

9. The semiconductor device package of claim 8, wherein the semiconductor device package is a wireless package.

10. The semiconductor device package of claim 8, wherein the die is a power die, the first clip is a load clip for the power die and the second clip is a sense clip for the power die or a gate clip for the power die.

11. The semiconductor device package of claim 8, further comprising:
    a first external terminal of the semiconductor device package; and
    a second external terminal of the semiconductor device package, wherein
    the first clip is bonded to the first external terminal and the second clip is bonded to the second external terminal.

12. The semiconductor device package of claim 11, wherein, the first and second external terminals are leads of a leadframe and the die carrier is a heat sink element and/or a die pad of the leadframe.

* * * * *

UNITED STATES PATENT AND TRADEMARK OFFICE
CERTIFICATE OF CORRECTION

PATENT NO. : 11,189,592 B2  
APPLICATION NO. : 16/588127  
DATED : November 30, 2021  
INVENTOR(S) : Upendra et al.

Page 1 of 1

It is certified that error appears in the above-identified patent and that said Letters Patent is hereby corrected as shown below:

In the Claims

Column 11, Line 11 (Claim 3), please change "boding" to -- bonding --.

Signed and Sealed this  
Eighth Day of March, 2022

Drew Hirshfeld  
*Performing the Functions and Duties of the*  
*Under Secretary of Commerce for Intellectual Property and*  
*Director of the United States Patent and Trademark Office*